United States Patent [19]

Ohmi et al.

[11] Patent Number: 5,895,509
[45] Date of Patent: Apr. 20, 1999

[54] ABRASIVE COMPOSITION

[75] Inventors: Tadahiro Ohmi, 1-17-301, Komegabukuro 2-chome, Aoba-ku, Sendai-shi, Miyagi-ken 980; Takahisa Nitta, Tokyo, both of Japan

[73] Assignees: Kabushiki Kaisha Ultraclean Technology Research Institute, Tokyo; Tadahiro Ohmi, Miyagi-ken, both of Japan

[21] Appl. No.: 08/980,649

[22] Filed: Dec. 1, 1997

[30] Foreign Application Priority Data

Dec. 6, 1996 [JP] Japan ................... 8-327363

[51] Int. Cl.$^6$ ........................................ B24D 3/34
[52] U.S. Cl. ................... 51/307; 51/308; 51/309; 252/79.1
[58] Field of Search ............... 51/307–309; 106/3; 252/79.1; 438/693

[56] References Cited

U.S. PATENT DOCUMENTS

| | | | |
|---|---|---|---|
| 5,094,687 | 3/1992 | Elepano | 106/3 |
| 5,352,277 | 10/1994 | Sasali | 51/309 |
| 5,697,992 | 12/1997 | Ueda et al. | 51/307 |
| 5,804,513 | 9/1998 | Sakatani et al. | 51/309 |

Primary Examiner—Deborah Jones
Attorney, Agent, or Firm—Randall J. Knuth

[57] ABSTRACT

An abrasive composition which can realize chemical-mechanical polishing superior in polishing speed and polishing uniformity.

The abrasive composition comprises abrasive grains, isopropyl alcohol, and water. Grain sizes of the abrasive grains are preferably 30 to 250 nm, and the abrasive grains are preferably $SiO_2$. Further, it is preferable that contents of the abrasive grains and isopropyl alcohol are 5 to 30 wt % and 1 to 15 wt %, respectively. The abrasive composition of the present invention is characterized in that it is deaerated.

5 Claims, 5 Drawing Sheets

Abrasive Composition (a)

(b)

ABRASIVE COMPOSITION

BACKGROUND OF THE INVENTION

1. Field of the Invention.

The present invention relates to an abrasive composition, and in particular to an abrasive composition used in chemical-mechanical polishing for a semiconductor surface in a semiconductor manufacturing process.

2. Description of the Related Art.

Recently, semiconductor devices have been improved very rapidly in their level of integration and structural fineness. To obtain high resolution in a photolithography process, demagnification optical exposure is employed in the main stream of the art, its resolution limit r and depth of focus DOF being shown in the following equations (1) and (2).

$$r = k_1 \cdot \lambda/NA \quad (1)$$

$$DOF = K_2 \cdot \lambda/NA^2 \quad (2)$$

As seen from the equations, when an optical system having a larger numerical aperture NA is used to increase a resolution limit r, depth of focus DOC becomes decreased, thus lowering the focus margin of the process.

On the other hand, structures of semiconductor devices became more complicated, accompanying advancement of multilayered wiring techniques. When wiring is multilayered, irregularity is increased more in a pattern in an upper layer of a semiconductor device, and/or defect such as disconnection of the wire is liable to occur because of deficiency of step coverage. Further, an optical system with large NA has difficulty in forming an entire image of a pattern.

Accordingly, planarization of inter layer insulating film has been studied, and in particular, chemical-mechanical polishing (CMP) has been noted because it can planarize wider areas and is researched vigorously.

In conventional chemical-mechanical polishing, planarization polishing of inter layer insulating film is performed with an abrasive composition consisting of silica dispersed in water, and employing an apparatus such as shown in FIG. 6. In FIG. 6, 601 refers to a wafer, which is mounted on a wafer support 602 which turns on its axis, revolves, and swings left, right, back and forth, with the wafer's surface to be polished being directed downward. A reference number 603 refers to an abrasive composition supply pipe for dropping an abrasive composition. By 604, is referred to a polishing pad mounted on a rotating pad support 605.

The abrasive composition is dropped onto the polishing pad 604 through the supply pipe 603. Relative movement between the wafer 601 and the pad 604 makes the dropped abrasive composition enter between the wafer 601 and the pad 604, thus the inter layer insulating film of the wafer 601 is polished by sliding on and being rubbed by the pad 604.

According to this conventional polishing method, however, it is difficult to supply the abrasive on a wafer surface entirely and uniformly, and its polishing uniformity is poor.

As a method to solve the problem, there has been studied a method in which holes are provided in a polishing pad and an abrasive composition is supplied through those holes, which increased uniformity in supplying an abrasive composition onto a wafer surface. However, the obtained uniformity in polishing is not sufficient, and its reproducibility is poor.

The present inventor has studied the cause of low polishing uniformity from both the viewpoint of polishing methods and abrasive compositions, to find that polishing uniformity is greatly affected by composition of an abrasive composition and static electrification properties of a polishing pad and the abrasive composition. The present invention has been completed, based on those findings.

SUMMARY OF THE INVENTION

An object of the present invention is to provide an abrasion composition which realizes a chemical mechanical polishing superior in speed and uniformity of polishing.

The abrasive composition of the present invention is characterized in that it comprises abrasive grains, isopropyl alcohol, and water.

Preferably, the size of the abrasive grains is 30 to 250 nm in their diameter. It is also preferable that the abrasive grains is $SiO_2$.

Preferably also, contents of the abrasive grains and isopropyl alcohol are 5 to 30 wt % and 1 to 15 wt %, respectively.

Further, the abrasive composition according to the invention is characterized in that it has been deaerated.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 3(a) showing the conventional case, and FIG. 3(b) the present invention;

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
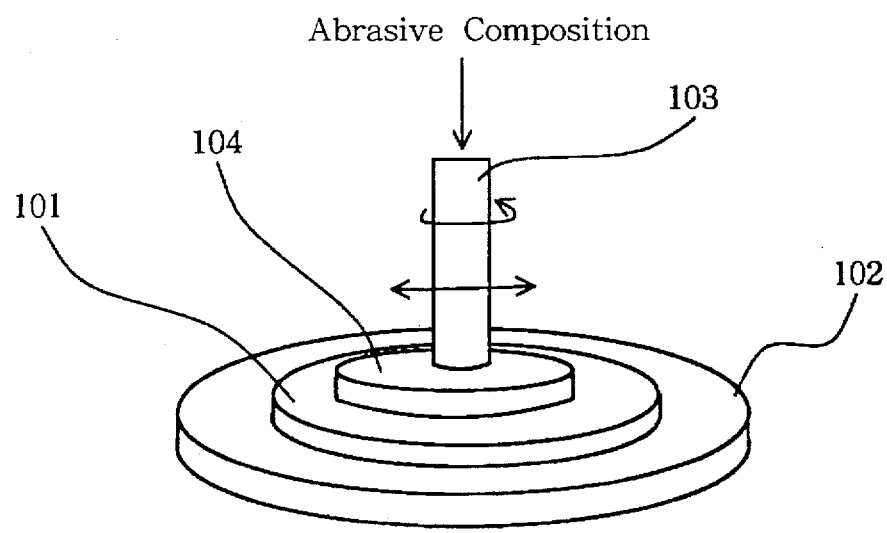
FIG. 1 is a conceptual view showing an example of a polishing apparatus with which the abrasive composition of the present invention is preferably applied.

Symbols
101 wafer (object to be polished)
102 rotatable support
103 hollow axis of rotation
104 polishing pad
201 hole for supplying the abrasive composition
601 wafer 602 wafer support
603 abrasive composition Supply pipe
604 polishing pad
605 pad support The abrasive composition according to the present invention is obtained by dispersing abrasive grains into water if needed, potassium hydroxide or the like may be added to make it alkaline and to improve aggregation-prevention), and by adding, little by little, a mixture consisting of isopropyl alcohol and water. Using the abrasive composition of the present invention, polishing speed and uniformity are improved.

In the present invention, as the abrasive grains, there may be used an inorganic abrasive rains such as an oxide, for example, silica, ceria ($CeO_2$), or the like, as well as organic resin type abrasive grains. When used for super fine polishing of semiconductor surface, such as inter layer insulating an formed on a surface of semiconductor for multilayered wiring it is preferable to use abrasive grains of oxide type, in particular, silica.

As for grain diameter of the abrasive grains, 30 to 250 nm is preferable. Using grains having diameters within this range, there is obtained high polishing speed and polishing uniformity. Grain diameters less than 30 nm decreases polishing speed, while, if it is more than 250 nm, polishing uniformity is decreased and, sometimes, the semiconductor surface is damaged.

Preferably, contents of the abrasive grains is 5 to 30 wt %. When it is less than 5 wt %, polishing speed is lowered, and when it is more than 30 wt %, the degree of dispersion is lowered to produce aggregations and to decrease polishing uniformity.

Mixing of isopropyl alcohol in the abrasive composition has an effect of spreading the abrasive grains over the pad surface, thus improving polishing uniformity.

The reason of this effect is not completely clarified yet, although it is supposed as follows. When an abrasive composition without isopropyl alcohol is used, polishing is proceeded in the portion adjacent to a supply port for the abrasive composition, thus lowering polishing uniformity. It is interpreted that, the abrasive grains are charged with electricity because of friction between the polishing pad and the abrasive grains, and the charged grains adsorbed by the polishing pad at its portion adjacent to the supply port for the abrasive composition. It is supposed that, when isopropyl, it controls electrification of the abrasive grains, or charges of the polishing pad and the abrasive grains become of the same sign, thus suppressing adsorption of the grains to the supply port.

In the present invention, the content of isopropyl alcohol is preferably 1 to 15 wt %. When it is 0.5 wt % or less, it has little effect, while when it is 20 wt % or more, uniformity is decreased, probably since the grains are aggregated and the flowability is decreased.

Further, by addition of isopropyl alcohol, the abrasive grains becomes reluctant to adhere to the wafer, thus making cleaning after the polishing easy. Further, a fluid film of isopropyl alcohol is formed on the wafer, and thus, it become easy to dry the wafer in clean conditions due to the so-called Marangoni effect.

Furthermore, it is preferable to deaerate the abrasive composition of the present invention. In some polishing conditions, air may be taken in, or gas may be generated during the polishing process, which becomes cause of decreasing polishing uniformity. By advance deaeration of the gases such as air dissolved in the composition, the composition can dissolve any gas generated during the polishing, thus preventing a decrease of polishing uniformity. As a preferable method of deaeration, a vessel may be divided into two chambers by a membrane, through which only gas is permeable, and then the abrasive composition is made to flow through one chamber and the other chamber is sucked to be vacuum. As the level of the amount of the dissolved gas, one of ppb order is preferable.

The abrasive composition according to the present invention may be used also preferably for polysilicon, aluminum alloy, other metal wiring, or the like embedded in a trench for example, as well as the above-described inter layer insulating film. Further, it can be used not only for polishing a semiconductor surface but also fur fine polishing of various materials, of course.

In the present invention, depending on uses, a surfactant may be added by about 100 ppm.

Next, there win be described a method of polishing a semiconductor wafer using the abrasive composition of the present invention.

FIG. 1 shows an example of a polishing apparatus to which the abrasive composition of the present invention is preferably applied.

In the figure, the reference number 101 refers to a wafer formed with a inter layer insulating film, for example. The wafer 101 is fixed on a rotatable support 102 by vacuum suction or the like. By the reference number 103, is shown a hollow axis of rotation, at whose tip, there is attached a polishing pad 104.

Figure 2:
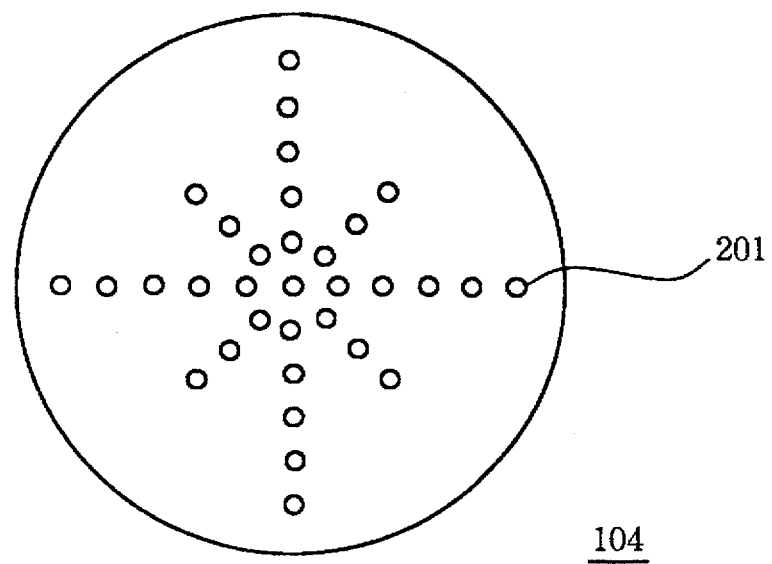
FIG. 2 is a conceptual view showing an example of an arrangement of holes provided in a pad for supplying the abrasive composition.

As shown in FIG. 2, the polishing pad 104 is provided with a plurality of holes 201 for supplying the abrasive composition.

The abrasive composition is supplied through the inside of the rotation axis 103 and the holes 201 into the portion between the wafer 101 and the polishing pad 104.

As shown in FIG. 1, there is employed the polishing pad 104 which is smaller than the wafer 101 for coping with in-plane variation of thickness of the wafer 101. Farther, the apparatus is so arranged that the abrasive composition is presently supplied from the inside of the polishing pad 104, thus the composition being supplied uniformly between the polishing pad 104 and the wafer 101.

Further, between the support 102 and the water 101, there is provided cushioning material (not shown) such as a back pad which applies uniform pressure loading onto the wafer 101.

The surface of the wafer 101 is polished while the abrasive composition is supplied into the portion between the polishing pad 104 and the wafer 101 with constant pressure, with the polishing pad 104 turning on its axis and revolving, and the wafer 101 being made to turn and swing in the horizontal direction. Preferably, the diameter of the holes made in the polishing pad 104 is 0.5 to 2.5 mm. Uniformity is increased more when a large number of small holes are provided.

Here, preferably, the turning speed of the polishing pad 104 is 100 to 1500 rpm and its revolving speed is 60 to 100 rpm, and the turning speed of the wafer 101 is 50 to 300 rpm. Further, the swinging of the polishing pad 104 is preferably 1 to 3 m/min. Further, the pushing pressure of the polishing pad 104 is about 100 to 600 $g/cm^2$.

The supply rate of the abrasive composition 50 to 100 ml/min. for an 8 inch wafer. Its supplying pressure is about 10 to 100 $g/cm^2$.

Further, a dummy plate may be provided so as to surround the periphery or the wafer 101 and to be in the same plane with the wafer surface to be polished. By this arrangement, even when a portion of the polishing pad 104 goes out of the wafer 101, the polishing pad 104 is not inclined, and the outer periphery of the wafer 101 is not polished excessively.

As a material for the polishing pad 104, any material may be used since static electrification can be controlled by using the abrasive composition Of the present invention. However, to attain higher uniformity of polishing, it is preferable to use a material having the static electrification of the same sign as the abrasive grains.

Depending on the material or the object to be polished, polishing quantity, and the like, suitable selection may be made on a kind of the abrasive grains, supplying pressure, supply rate, material of the pad, turning speed, revolving speed, swinging, pushing pressure, turning speed of a wafer, and the like.

By using the above-described polishing method, together with high uniformity and polishing speed of the abrasive composition of the present invention, it is possible to perform polishing which requires very high accuracy, such as planarization of a semiconductor surface.

Embodiment

In the following, an embodiment is shown to describe the present invention in detail.

In the present embodiment, to clarify the effect of the abrasive composition of the present invention, polishing is performed in the apparatus shown in FIG. 1 while only the polishing pad 104 is made to turn, without the turning and swinging of the wafer 101 and without the revolving tithe polishing pad 104.

As an object to be polished, there is used a six inch silicon wafer formed with a thermal oxidation film. The polishing pad 104 is made to have pushing pressure of 600 g/cm$^2$, and turning speed of 1000 rpm. The supply rate and supply pressure of the abrasion composition are made to be 75 ml/min and 500 g/cm$^2$, respectively.

The polishing pad 104 is a commercial one (IC-1000 sold by Rodhel Ltd.) made of polyurethane as its main component, and having a diameter of 60 mm. The polishing pad 104 is provided with holes of 2 mm φ arranged at intervals of 5 mm the radial direction, as shown in FIG. 2.

As the abrasive composition, there is employed one obtained by dispersing 12 wt % of silica (SiO$_2$) with grain diameters of 30 to 50 nm into fluid consisting of water and isopropyl alcohol in various ratios.

The results of polishing are shown in FIGS. 3(b) and 3(a); FIG. 3(b) showing the case of using the composition of the present embodiment added with 5 wt % of isopropyl alcohol, and FIG. 3(a) the case of using the conventional composition without isopropyl alcohol added.

As shown by FIGS. 3(a) and 3(b), it was found that polishing quantities shown by the thickness of the oxide film were large in corresponding to the positions of the holes, which was more obvious in FIG. 3(b) corresponding to the present embodiment. Namely, by adding isopropyl alcohol, uniformity of polishing was increased.

To investigate the reason, charge of electrification was measured using a surface potentiometer for the pad and the abrasive composition just after the polishing. The results are shown in FIG. 4.

Figure 4:
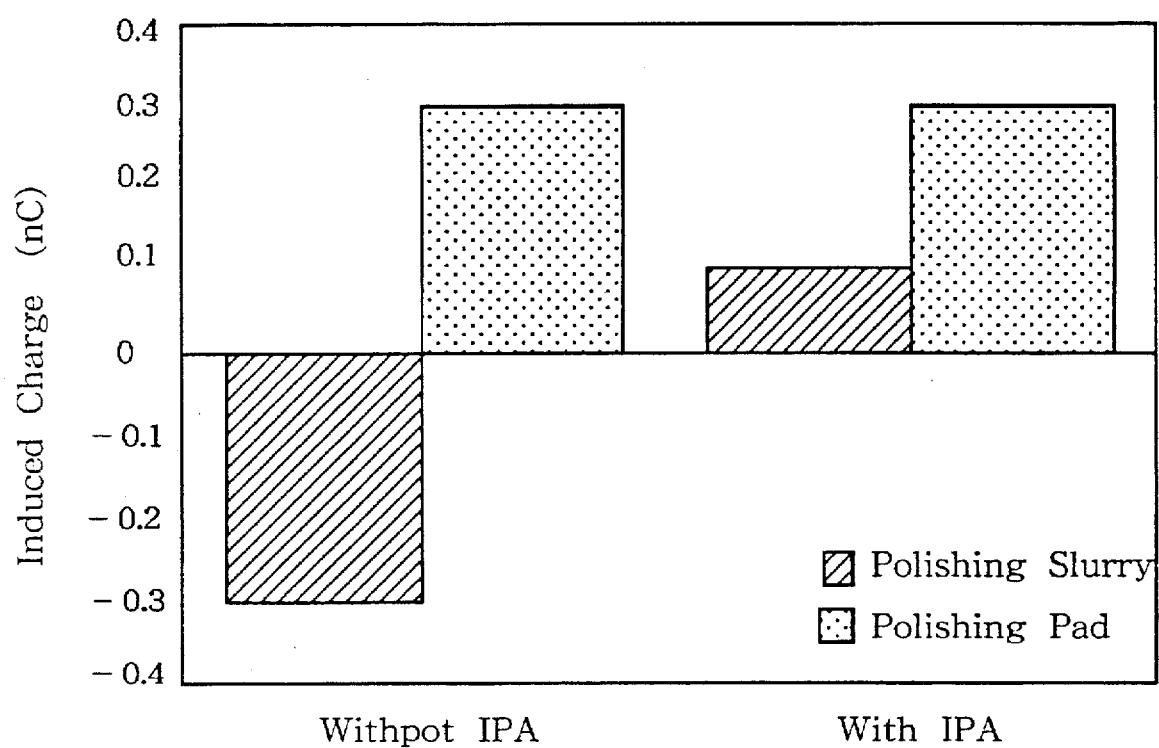
FIG. 4 is a graph showing static electrification properties of the abrasive composition and file pad.

As obvious from FIG. 4, in the case of the conventional composition, the pad and the composition are of charges with opposite signs. On the other hand, in the case of the abrasive composition of the present embodiment including isopropyl alcohol, their charges are of the same sign, and the magnitudes are smaller than the conventional case. This fact is interpreted to mean that, in the case of the conventional composition, the abrasive is adsorbed by the pad unevenly, resulting in larger uniformity in polishing, while addition of isopropyl alcohol controls the absorption so that the abrasive grains are supplied all over the contact surfaces of the pad and the wafer to improve polishing uniformity and polishing speed.

Figure 3:
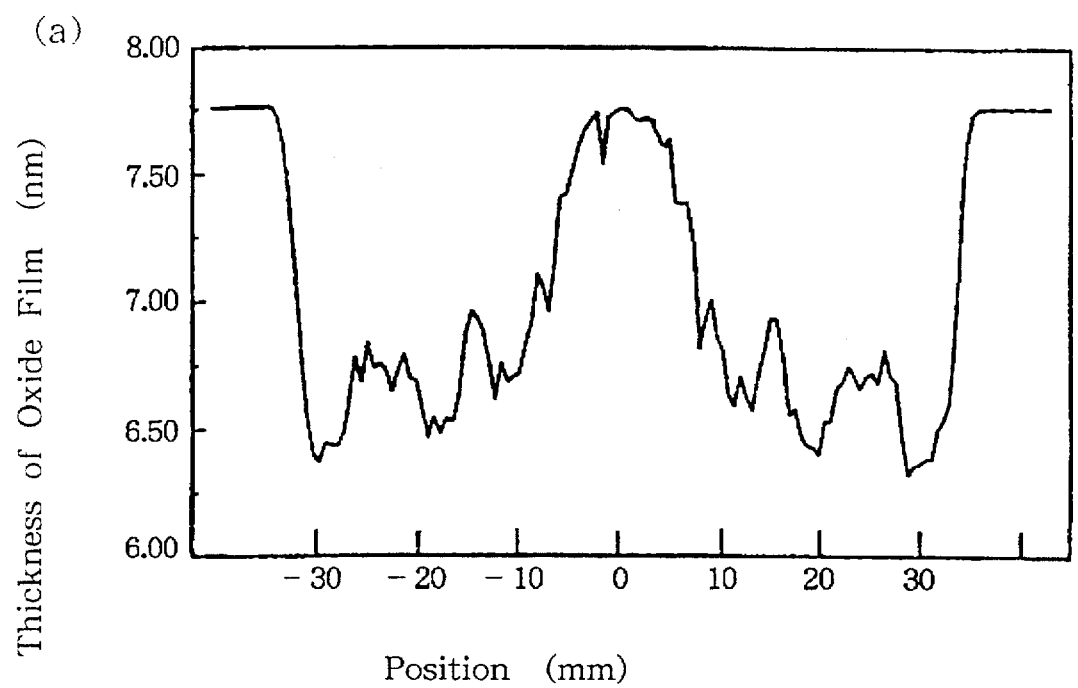
FIGS. 3(a) and 3(b) are graphs showing polished results over a surface of a pad by the abrasive composition of the present invention and by the conventional abrasive composition.
Figure 3:
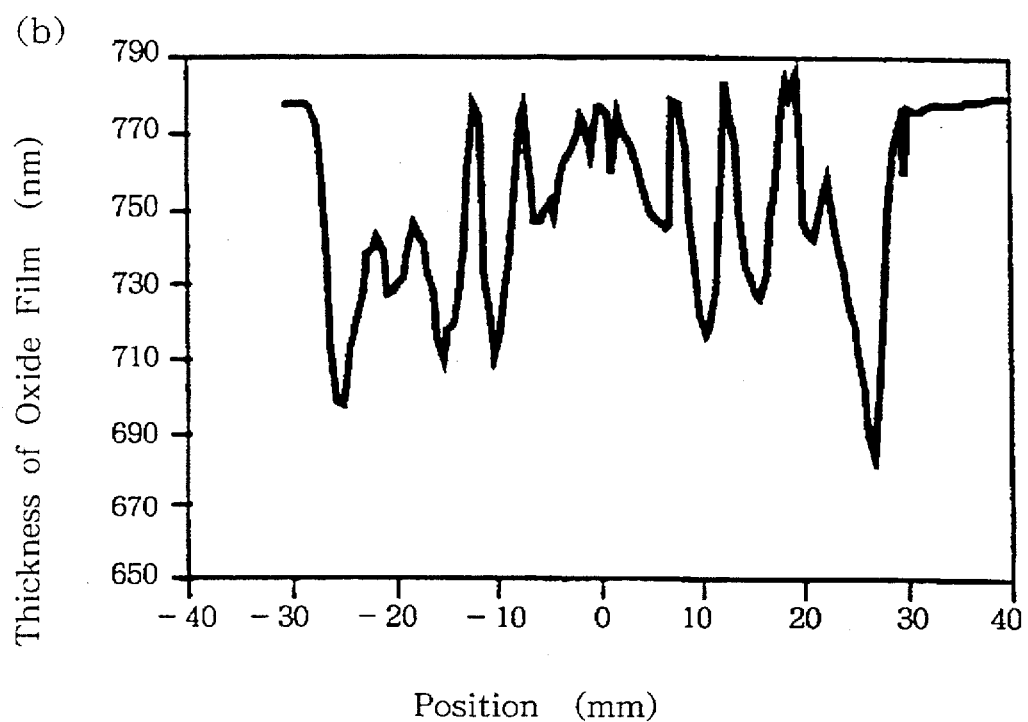

As shown in FIG. 3, polishing speed is lower in the central portion of the wafer, which is due to the lower peripheral speed caused by the small radius of the wafer. By such an operation of making the pad revolve etc., the entire surface of the wafer can be polished with same degree.

Figure 5:
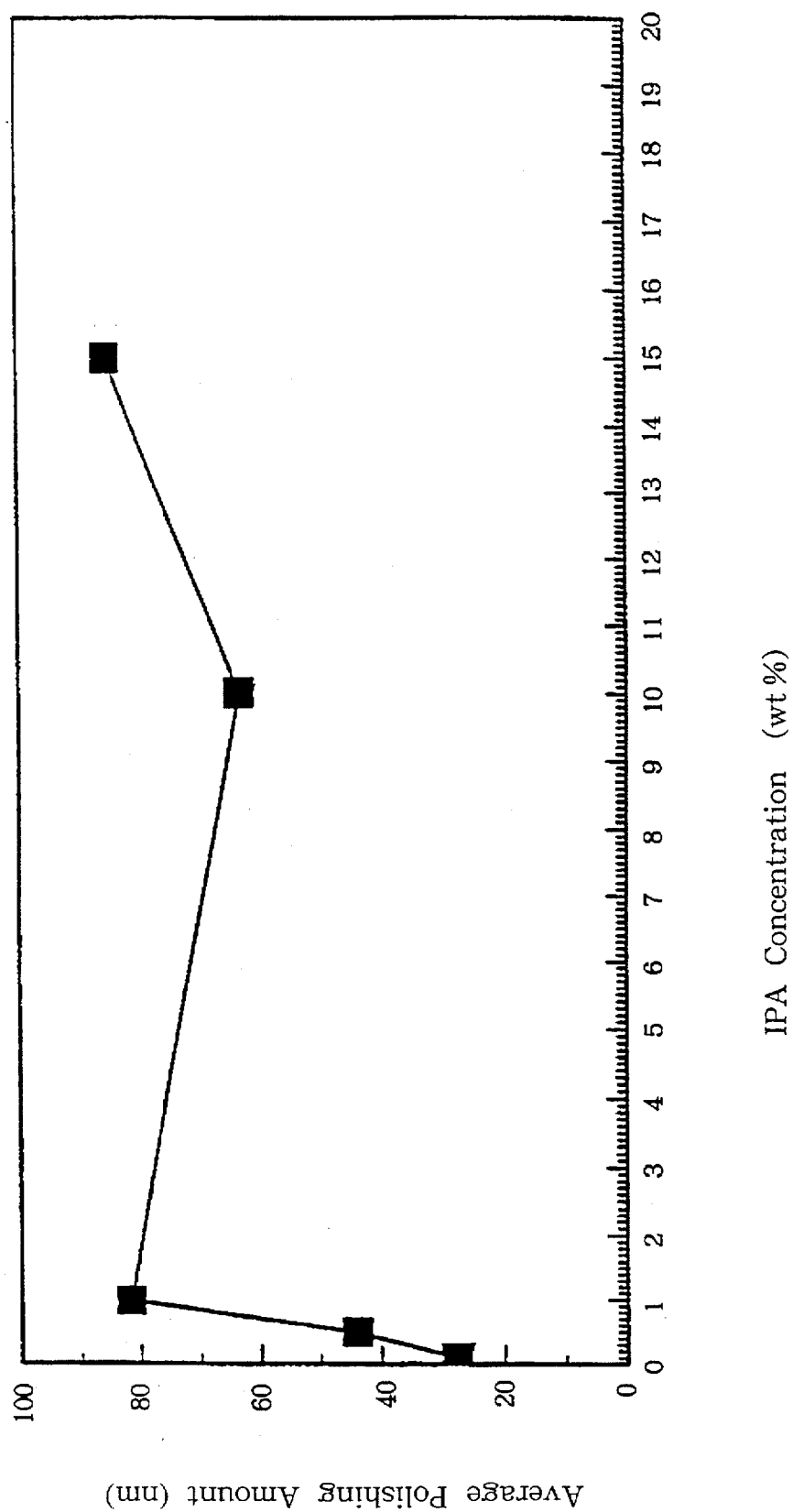
FIG. 5 is a graph showing a relation between content of isopropyl alcohol and mean polishing speed.
Figure 6:
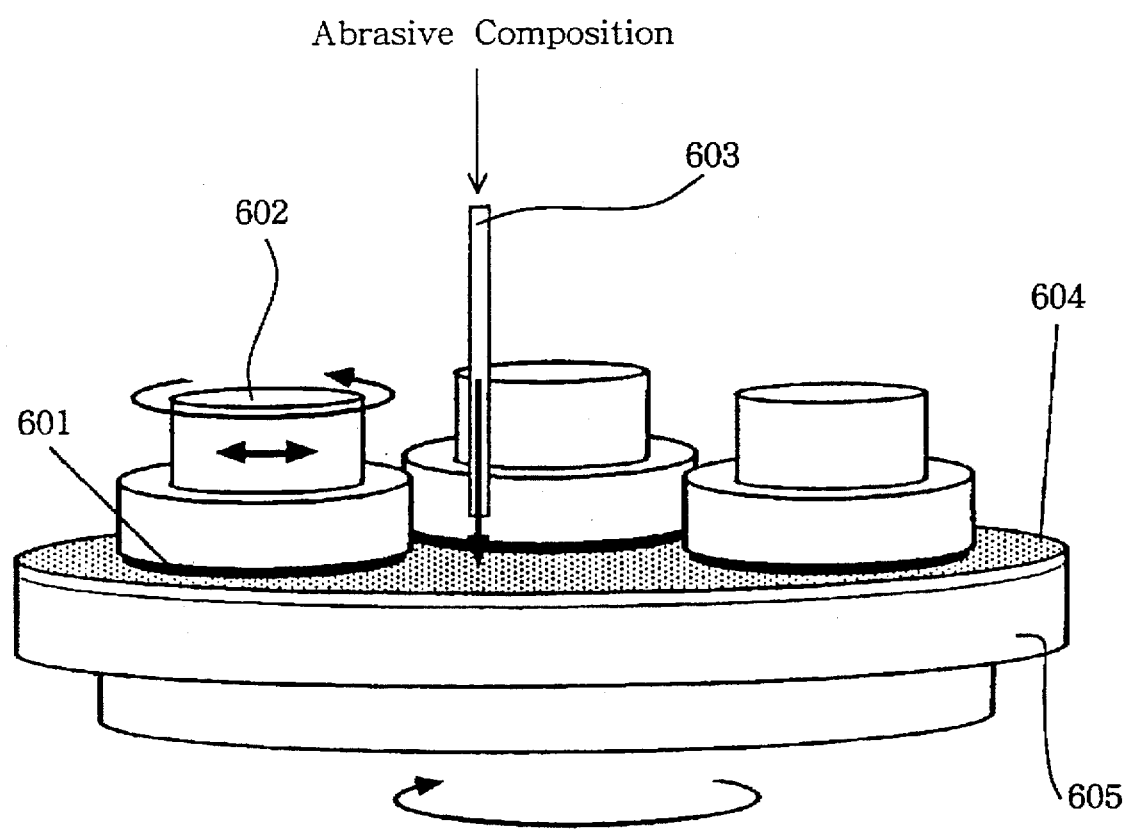
FIG. 6 is a conceptual view showing an ordinary chemical-mechanical polishing apparatus.

Next, in FIG. 5, there are shown average amounts of polishing in the case that polishing is performed for 1 minute using the compositions containing isopropyl alcohol in various ratios.

As obvious from the figure, it is found that polishing speed is increased by adding isopropyl alcohol, and in particular, in the range of 1 to 15 wt %, very high polishing speed can be obtained.

As described above, it is found that by using the abrasive composition of the present invention, high uniformity and high speed of polishing can be obtained.

According to the present invention which provides the abrasive composition comprising abrasive grains, isopropyl alcohol, and water, there can be provided the chemical-mechanical polishing method which can attain very high uniformity and speed in polishing.

Thus, the present invention contributes not only to realize an integrated circuit with a higher degree of integration, but also largely to put a three-dimensional device to practical use.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An abrasive composition comprising abrasive grains, isopropyl alcohol, and water.

2. The abrasive composition according to claim 1, wherein grain sizes of said abrasive grains are 30 to 250 nm.

3. The abrasive composition according to claim 1 wherein said abrasive grains are SiO$_2$.

4. The abrasive composition according to claim 1 wherein the contents of said abrasive grains and said isopropyl alcohol are 5 to 30 wt % and 1 to 15 wt %, respectively.

5. The abrasive composition according to claim 1 wherein said composition is deaerated.

* * * * *